United States Patent
Zrilic

(10) Patent No.: US 9,575,729 B1
(45) Date of Patent: Feb. 21, 2017

(54) DIGITAL ARCHITECTURE FOR DELTA-SIGMA RMS-TO-DC CONVERTER

(71) Applicant: Djuro G. Zrilic, Sante Fe, NM (US)

(72) Inventor: Djuro G. Zrilic, Sante Fe, NM (US)

(*) Notice: Subject to any disclaimer, the term of this patent is extended or adjusted under 35 U.S.C. 154(b) by 15 days.

(21) Appl. No.: 14/999,288

(22) Filed: Apr. 21, 2016

(51) Int. Cl.
*H03M 3/00* (2006.01)
*G06F 7/60* (2006.01)
*H03M 1/12* (2006.01)
*H03M 1/00* (2006.01)
*H04L 27/26* (2006.01)

(52) U.S. Cl.
CPC ............ *G06F 7/602* (2013.01); *H03M 3/458* (2013.01); *H03M 1/00* (2013.01); *H03M 1/12* (2013.01); *H03M 3/30* (2013.01); *H04L 27/2647* (2013.01)

(58) Field of Classification Search
CPC . H03M 3/30; H03M 1/00; H03M 1/12; H04L 27/2647
USPC ................ 341/143, 110, 118, 120, 155, 156; 375/316
See application file for complete search history.

(56) References Cited

U.S. PATENT DOCUMENTS

| | | | |
|---|---|---|---|
| 5,349,353 A | 9/1994 | Zrilic | |
| 6,137,429 A * | 10/2000 | Chan | H03M 3/324 341/143 |
| 6,285,306 B1 | 9/2001 | Zrilic | |
| 6,587,061 B2 | 7/2003 | Petrofsky | |
| 9,141,339 B2 | 9/2015 | Zrilic | |

OTHER PUBLICATIONS

U.S. Appl. No. 29/505,520, filed Dec. 3, 2015, Djuro Zrilic, Pending.
Wei-Shin Wey, Yu-Chung Huang, "A CMOS Delta-Sigma True RMS Converter", IEEE Journal of Solid-State Circuits, vol. 35, No. 2, Feb. 2000.
Jim Williams, "Intrumentation Circuitry Using RMS-to-DC Converters", Application Note 106, Feb. 2007, Linear Technology Corp.

* cited by examiner

*Primary Examiner* — Joseph Lauture

(57) ABSTRACT

Disclosed is a completely digital solution for a new type of root-mean-square to direct current conversion (RMS-to-DC) apparatus. The design is based on delta-sigma modulation (Δ-ΣM) and the direct nonlinear processing of the Δ-Σ modulated pulse stream. The only external component of the integrated circuit (IC) is capacitor C. The disclosed apparatus consists of low power consuming components which are simple, reliable and inexpensive.

1 Claim, 6 Drawing Sheets

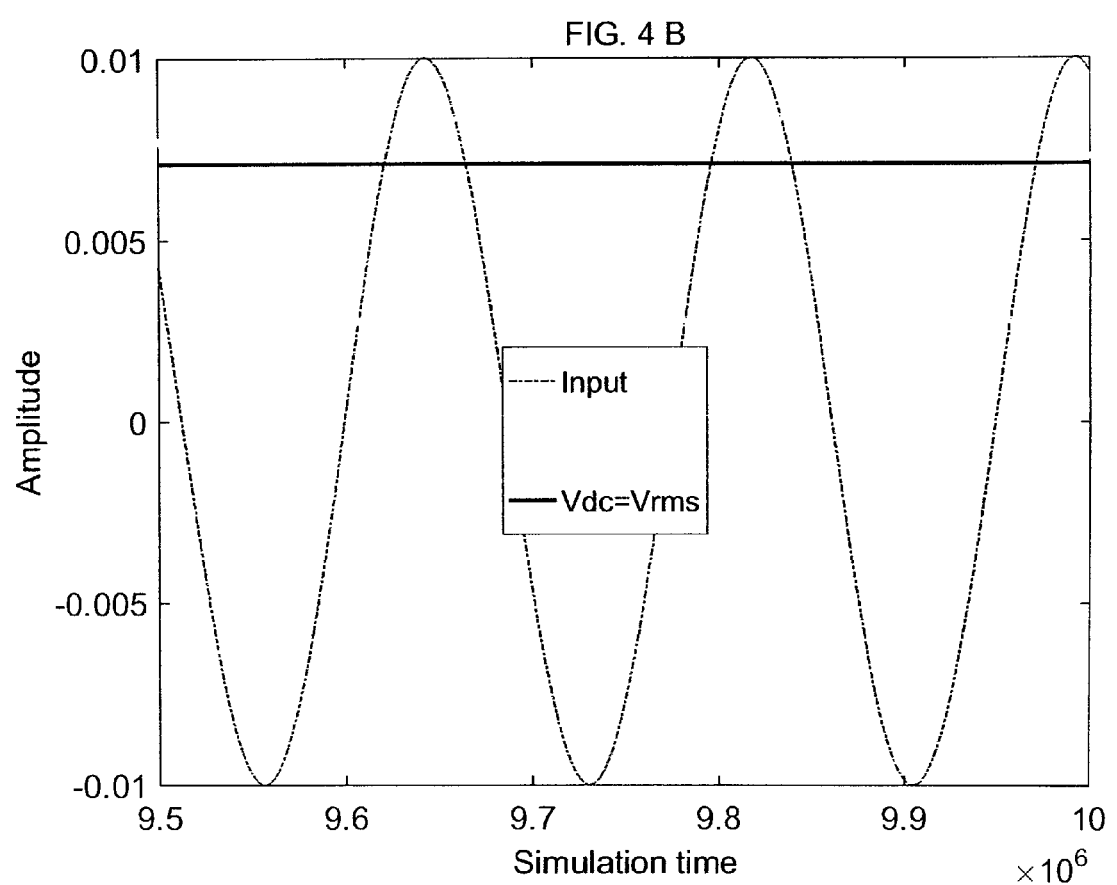

DIGITAL ARCHITECTURE FOR DELTA-SIGMA RMS-TO-DC CONVERTER

STATEMENT REGARDING FEDERALLY SPONSORED R&D

These research results are not sponsored by Government grants.

CROSS REFERENCES TO RELATED APPLICATIONS

Dj. Zrilic, U.S. Pat. No. 5,349,353, Date of patent: Sep. 20, 1994
Dj. Zrilic, U.S. Pat. No. 6,285,306 B1, Date of Patent: Sep. 4, 2001
J. G. Petrofsky, U.S. Pat. No. 6,587,061 B2, Date of Patent: Jul. 1, 2003
Dj. Zrilc, U.S. Pat. No. 9,141,339 B2, Date of Patent: Sep. 22, 2015
Dj. Zrilic, U.S. patent application Ser. No. (Pending): 29/505,520, Dec. 3, 2015.

NAME OF PARTIES TO A JOINT RESEARCH AGREEMENT

Individual project of Dr. Djuro G. Zrilic

BACKGROUND OF INVENTION

1. Field of the Invention (0001) The present invention relates to methods and apparatus for the nonlinear processing of delta-modulated pulse stream. The analog input signal is first converted into a one-bit high density pulse stream using the delta-sigma modulator ($\Delta$-$\Sigma$M) as an analog-to-digital converter (ADC). $\Delta$-$\Sigma$M is highly oversampled and its pulse stream is nonlinearly processed in the rectifying encoder (RE), then filtered and fed back into a reference input of the $\Delta$-$\Sigma$ modulator. This circuit is known as the root-mean-square to direct current converter (RMS-to-DC). Thus, the field of this invention is a nonlinear processing of $\Delta$-$\Sigma$M one-bit pulse stream and it belongs to the area of non-linear digital signal processing (DSP).

2. Description of the Prior Art

There are a number of published references dealing with integrated RMS-to-DC converters. The majority of these publications deal with analog processing methods using trans-linear property of bipolar circuitry. These converters are difficult to implement in standard CMOS processes.

In the digital processing methods, which use high-speed n-bit ADC, the RMS value of an input signal is calculated by ordinary DSP calculation methods. The problem is that the digital computation unit occupies a large chip area and thus, does not lead to a low-cost solution.

To cope with analog component limitations, the use of $\Delta$-$\Sigma$ modulation is proposed in reference [1]. A similar approach is used by Linear Technology Inc. [2]. In both approaches an analog signal is $\Delta$-$\Sigma$ modulated and then multiplied (in a multiplying DAC) by a polarity signal at the output of $\Delta$-$\Sigma$ modulator. This mixed processed signal is then filtered and fed back to the negative input of the $\Delta$-$\Sigma$ modulator as a reference signal. When the reference input signal of a $\Delta$-$\Sigma$ modulator is taken into account, then the output of the modulator can be interpreted as a ratio-metric function plus quantization noise [U.S. Pat. No. 6,587,061 B2].

The mixed mode analog/digital multiplier, which performs the squaring operation of the analog signal by means of $\Delta$-$\Sigma$M, is known as a polarity switch, and is proposed in reference [U.S. Pat. No. 6,285,306 B1].

BRIEF SUMMARY OF THE INVENTION

This invention introduces a novel RMS-to-DC converter based on the nonlinear processing of the $\Delta$-$\Sigma$ modulated pulse stream. It is based on the use of a direct squaring operation of $\Delta$-$\Sigma$ pulse stream. The objective of the invention will be apparent upon consideration of the following detailed description, taken in conjunction with the accompanying drawings presented here:

FIG. 1 shows a schematic diagram of a prior art. This RMS-to-DC converter uses synchronous $\Delta$-$\Sigma$M topology;

FIG. 2 shows a squaring circuit, (prior art);

FIG. 3 shows a block diagram of RMS-to-DC converter constructed in accordance with the present invention;

FIGS. 4 A, and 4 B show relevant waveforms of RMS signals for $\Delta$-$\Sigma$ modulators of the first and second order respectively;

FIG. 5 shows the linearity transfer function of the invented RMS-to-DC converter.

The objective of this invention is to reduce power consumption.

It is still another objective of the present invention to reduce the silicon area and provide a simple and inexpensive digital solution for the very large scale integration (VLSI) design. The only external component of this integrated circuit (IC) is the smoothing capacitor.

It is still a future objective of the present invention to employ the first order $\Delta$-$\Sigma$M, the second order $\Delta$-$\Sigma$M or any higher order $\Delta$-$\Sigma$M as an ADC.

It is still a future objective to employ a squaring circuit as proposed in reference [U.S. patent application Ser. No. (Pending): 29/505,520]. This circuit can operate as a rectifier of $\Delta$-$\Sigma$ modulated signal as well, depending on the width of the low-pass filter.

BRIEF DESCRIPTION OF DRAWINGS

FIG. 4B shows an example of a sinusoidal AC waveform and its RMS (DC) value for the second order $\Delta$-$\Sigma$M-to-DC converter.

DETAILED DESCRIPTION OF THE INVENTION

Definition

RMS or Root Mean Square is a fundamental measurement of the magnitude of an alternate current (AC) signal. Its definition can be both mathematical and practical. Mathematically the RMS is defined as:

$$V_{rms} = \text{square root of [average}(V^2)]$$

This formula involves squaring the signal, taking the average, and obtaining the square root. The averaging time must be sufficiently long to allow filtering at the lowest frequencies of the operation desired.

Practical definition: the RMS value assigned to an AC is the amount of direct current (DC) required to produce an equivalent amount of heat in the same load.

How to Make the Invention

Figure 1:
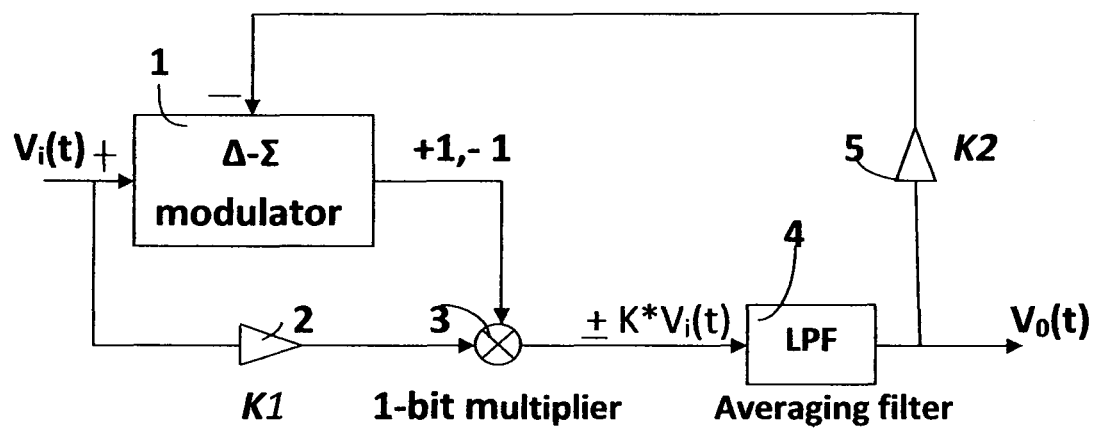
FIG. 1 shows a block diagram of an existing $\Delta$-$\Sigma$M RMS-to-DC circuit published in reference [1]. It consists of a $\Delta$-$\Sigma$ modulator, a hybrid analog/digital multiplier, an analog low-pass filter (LPF) and two analog multiplying circuits for multiplication by constants K1 and K2.
Figure 2:
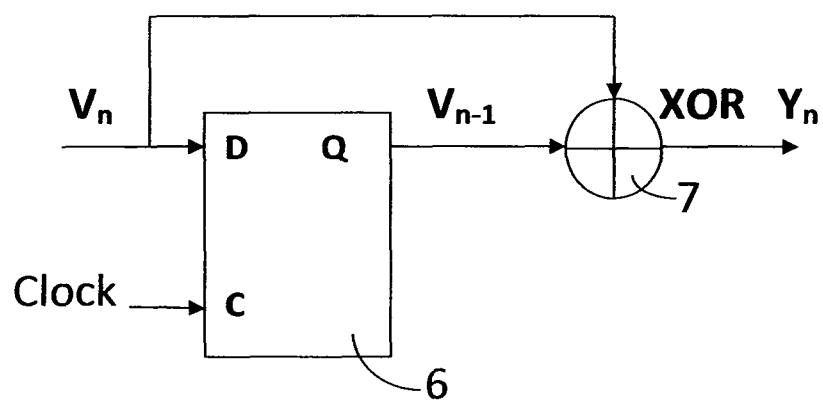
FIG. 2 shows a logic diagram of a squaring circuit. It consists of the D-FF and X-OR gate only. This circuit can be employed as rectifier of $\Delta$-$\Sigma$ signal as well [U.S. patent application Ser. No. 29/505,520].
Figure 3:
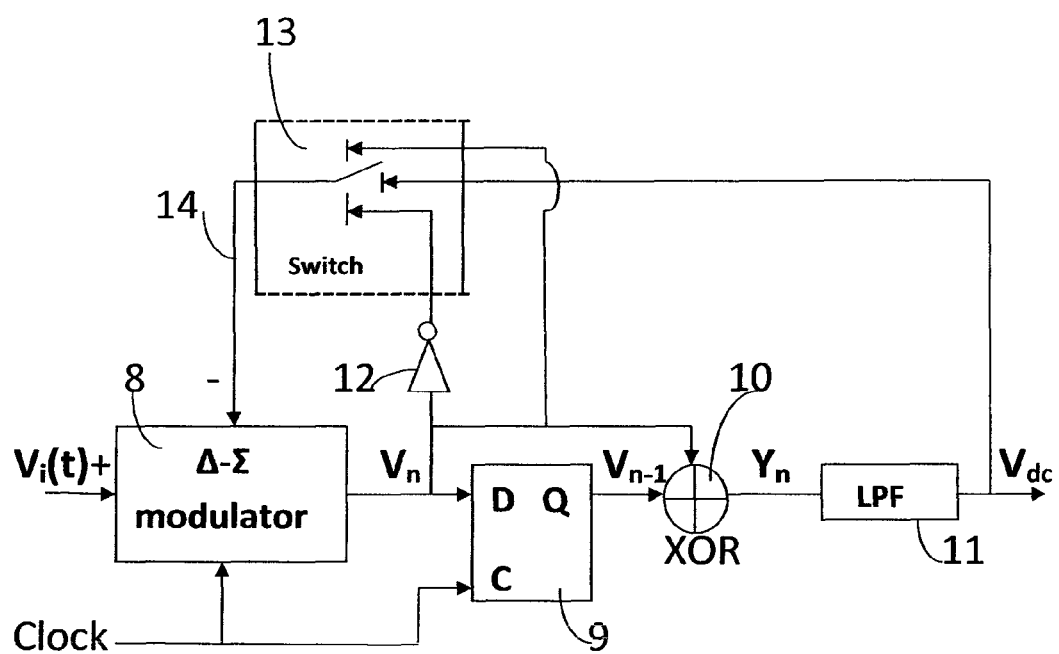
FIG. 3 shows a block diagram of the newly proposed digital RMS-to-DC converter. It consists of the first or higher order $\Delta$-$\Sigma$M, squaring circuit, polarity switch, and LPF, which consist of internally integrated resistor R and external capacitor C.

A full embodiment of the circuit for the RMS-to-DC operation on Δ-ΣM signal is shown in FIG. 3. Its operation is as follows:

The input signal $V_i(t)$ is converted by means of Δ-εM (8) into a digital pulse stream $V_n$. Squaring of a pulse stream $V_n$ is achieved by a simple logic circuit which consists of D flip-flop and X-OR gate. This circuit is presented in FIG. 2 and it is embedded in FIG. 3 (logic circuits 9 and 10). Its operation is described by the Boolean logic expression: $Y_n = \text{mod2 } V_{n-1}$. The squared pulse stream $Y_n$ is fed into the low-pass filter (LPF, 11) of low cut-off frequency to obtain a DC signal $V_{dc}$. This DC signal is fed back into the polarity switch (13) and it is switched between +1 and −1 of polarity signal $V_n$. The output signal of the switch (14) is fed directly into the negative input of Δ-ΣM (8).

Figure 4:
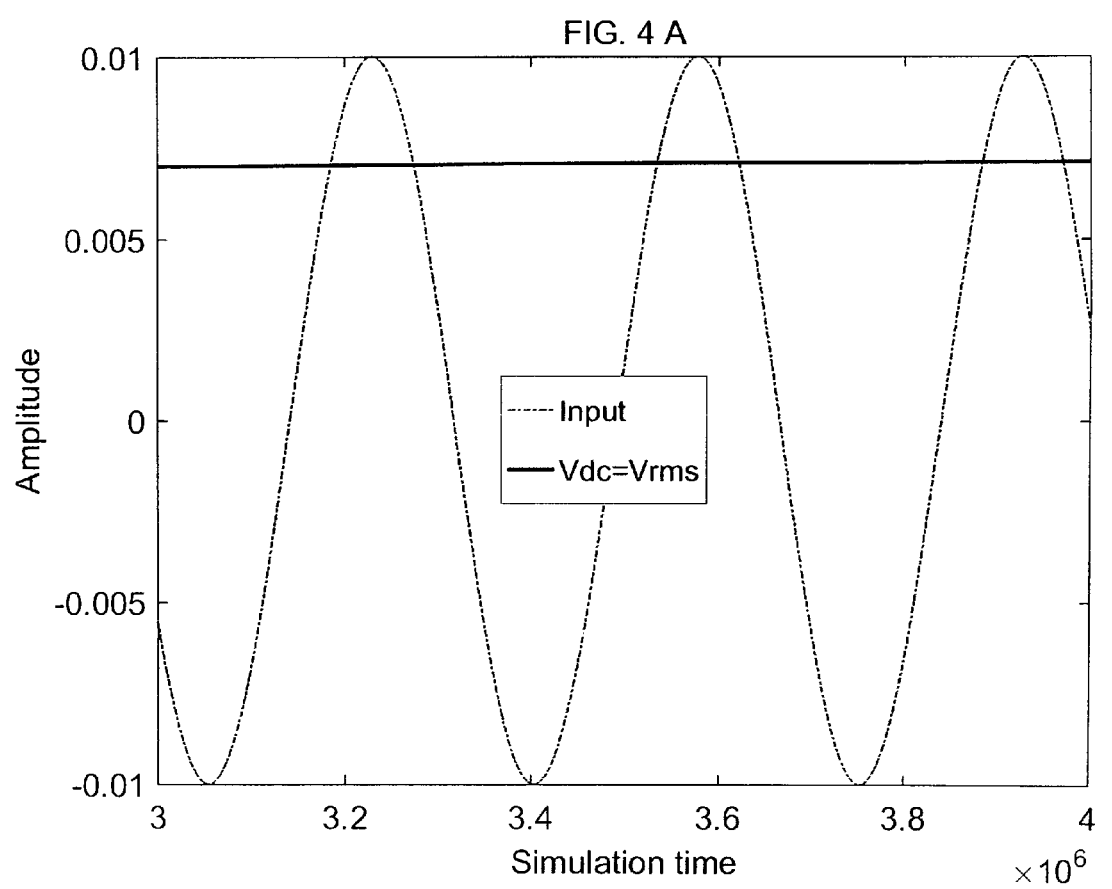
FIG. 4 A shows an example of a sinusoidal AC waveform and its RMS (DC) value for the first order $\Delta$-$\Sigma$M RMS-to-DC converter.

The validity of operation of the invention is verified trough intensive simulations. In FIG. 4A corresponding waveforms are shown when Δ-ΣM of the first order is employed as ADC. As an illustrative example of the conversion of a sinusoidal signal of normalized amplitude of $V_{in}=0.01$, and frequency of 10 Hz, is shown. Its corresponding DC value is $V_{dc}$. We can see a good agreement with theory ($V_{rms}=V_{dc}=0.707V_{in}=0.00707$).

Similarly, employing Δ-ΣM of the second order, FIG. 4B is generated. Again we can see a good agreement with theory. In this example normalized input amplitude is $V_{in}=0.01$. The oversampling ratio of both Δ-Σ modulators is $F_s/F_{in}=10^4$.

Figure 5:
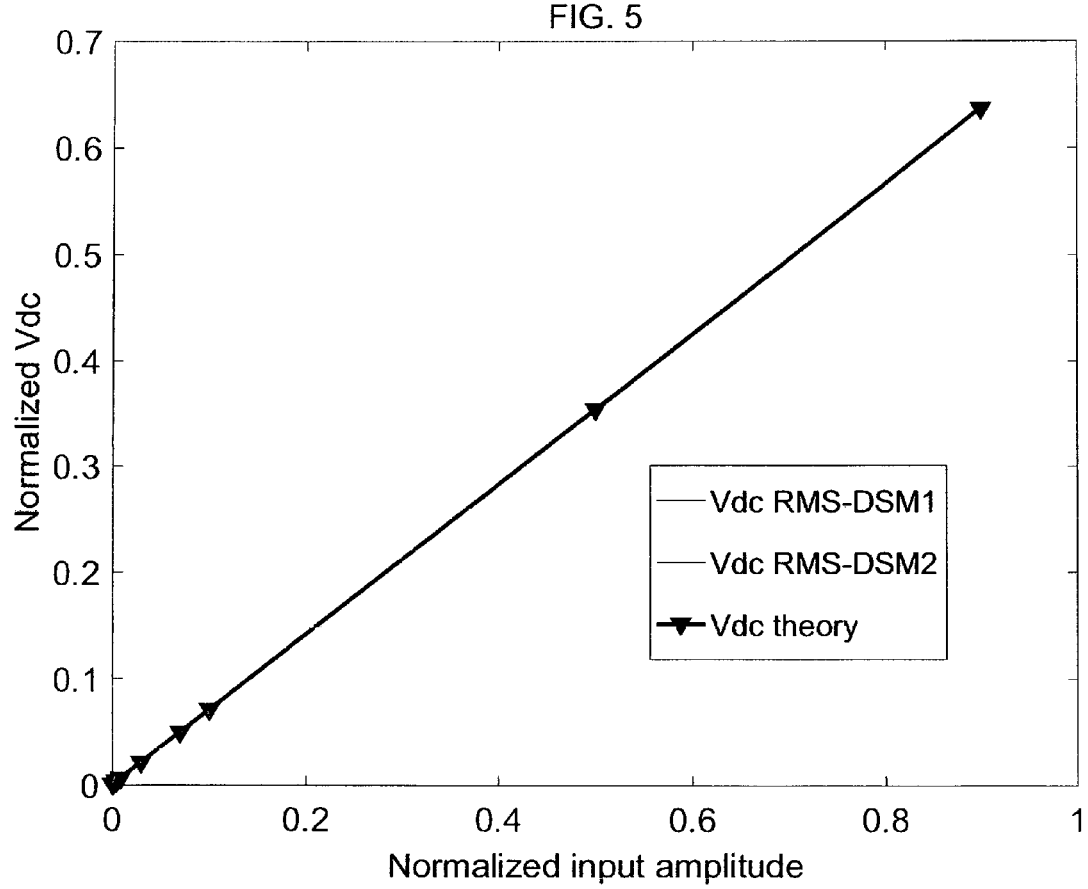
FIG. 5 shows the linear transfer function for both the first and the second order Δ-ΣM RMS-to-DC converters.

FIG. 5 shows the transfer function, $V_{dc}=0.707V_{in}$, for both RMS-to-DC converters employing the first order and the second order Δ-ΣM. For comparison reasons both transfer functions are plotted on the same diagram with a theoretical ($V_{the}=V_{dc}=0.707V_{in}$. We can see a good agreement with theory.

How to Use the Invention

Δ-Σ modulation is a well-established analog-to-digital conversion (ADC) process. It is a low power consuming high resolution one bit conversion process, and it is suitable for VLSI design. It can find applications in low frequency ADC processes such as bio-medical applications, environmental monitoring, seismic, instrumentation, etc. It can find application in both audio and radio frequencies as well. The RMS-to-DC Δ-ΣM circuit can be used for automatic gain control (AGC) of the amplifier to maintain a constant output level with variations in waveform, duty cycle and frequency. The RMS-to-DC Δ-ΣM instrument can be used as a low cost true RMS digital panel meter for direct measurement of power consumption in different house-hold appliances such as a stove, TV set, refrigerator, etc. It can be implemented as an AC line-powered version. The RMS-to-DC Δ-ΣM circuit can be used as a portable high impedance input RMS panel meter and dB meter for a modem line monitor. The RMS-to-DC Δ-ΣM can be used in micro-grid power lines metering and mobile communication radio frequency level monitoring. The RMS-to-DC Δ-ΣM circuit can find applications in data acquisition systems for detection of a signal level or testing and grading components such as transistors, op amplifiers and many others.

Thus, it will be appreciated by those skilled in the art that the present invention is not restricted to the particular preferred uses described with reference to the drawings, and that variations may be made therein without departing from the scope of the present invention. The same circuit can be employed for the direct processing of band-pass Δ-ΣM signals.

What is claimed is:

1. A digital circuit for squaring or rectifying operation of a delta sigma modulated signal, the circuit comprising:
   a first order or higher order Δ-ΣM for producing a pulse density signal $V_n$;
   a delay flip-flop D for delaying the signal $V_n$ for one clock pulse;
   a XOR gate for accepting the signals $V_n$ and $V_{n-1}$ to produce signal $Y_n$;
   a low-pass filter LPF to produce signal $V_{dc}$; and
   a polarity switch whose output is fed into second input terminal of Δ-Σ modulator.

* * * * *